US012571090B2

(12) United States Patent
Dieguez-Campo et al.

(10) Patent No.: US 12,571,090 B2
(45) Date of Patent: *Mar. 10, 2026

(54) METHOD FOR CLEANING A VACUUM SYSTEM USED IN THE MANUFACTURE OF OLED DEVICES, METHOD FOR VACUUM DEPOSITION ON A SUBSTRATE TO MANUFACTURE OLED DEVICES, AND APPARATUS FOR VACUUM DEPOSITION ON A SUBSTRATE TO MANUFACTURE OLED DEVICES

(71) Applicant: Applied Materials, Inc., Santa Clara, CA (US)

(72) Inventors: Jose Manuel Dieguez-Campo, Hanau (DE); Stefan Keller, Mainaschaff (DE); Jae Won Lee, Aschaffenburg (DE); Takashi Anjiki, Kyoto (JP); Dieter Haas, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 150 days.

This patent is subject to a terminal disclaimer.

(21) Appl. No.: 18/139,246

(22) Filed: Apr. 25, 2023

(65) Prior Publication Data

US 2023/0256483 A1      Aug. 17, 2023

Related U.S. Application Data

(63) Continuation of application No. 16/318,052, filed as application No. PCT/EP2017/060239 on Apr. 28, 2017, now Pat. No. 11,673,170.

(51) Int. Cl.
| | |
|---|---|
| *C23C 14/56* | (2006.01) |
| *B08B 3/08* | (2006.01) |

(Continued)

(52) U.S. Cl.
CPC .............. *C23C 14/564* (2013.01); *B08B 3/08* (2013.01); *B08B 7/0035* (2013.01); *B08B 7/04* (2013.01);
(Continued)

(58) Field of Classification Search
CPC .... H10K 71/00; H10K 71/166; H10K 71/164; B08B 3/08; B08B 7/0035; B08B 7/04;
(Continued)

(56) References Cited

U.S. PATENT DOCUMENTS

| | | | |
|---|---|---|---|
| 2001/0011423 A1* | 8/2001 | Kato ................ | H01L 21/67736 34/92 |
| 2002/0020429 A1 | 2/2002 | Selbrede et al. | |

(Continued)

FOREIGN PATENT DOCUMENTS

| | | |
|---|---|---|
| CN | 1534806 A | 10/2004 |
| EP | 1998389 A1 | 12/2008 |

(Continued)

OTHER PUBLICATIONS

International Search Report and Written Opinion dated Feb. 15, 2018 for Application No. PCT/EP2017/060239.
(Continued)

*Primary Examiner* — Brook Kebede
(74) *Attorney, Agent, or Firm* — Patterson + Sheridan, LLP

(57) ABSTRACT

The present disclosure provides a method for cleaning a vacuum system used in the manufacture of OLED devices. The method includes performing pre-cleaning for cleaning at least a portion of the vacuum system, and performing plasma cleaning using a remote plasma source.

20 Claims, 3 Drawing Sheets

(51) Int. Cl.
    *B08B 7/00*          (2006.01)
    *B08B 7/04*          (2006.01)
    *B08B 9/08*          (2006.01)
    *C23C 14/12*         (2006.01)
    *C23C 14/24*         (2006.01)
    *H10K 71/16*        (2023.01)

(52) U.S. Cl.
    CPC ................ *B08B 9/08* (2013.01); *C23C 14/12*
            (2013.01); *C23C 14/24* (2013.01); *C23C*
          *14/566* (2013.01); *H10K 71/164* (2023.02);
          *H10K 71/166* (2023.02); *B08B 2209/08*
                              (2013.01)

(58) Field of Classification Search
    CPC ........... B08B 9/08; C23C 14/12; C23C 14/24;
                                 C23C 14/566
    See application file for complete search history.

(56)                References Cited

U.S. PATENT DOCUMENTS

| | | | | |
|---|---|---|---|---|
| 2009/0056743 | A1* | 3/2009 | Choi | B08B 7/0035 |
| | | | | 134/1.1 |
| 2009/0317927 | A1* | 12/2009 | Hoffmann | C23C 14/12 |
| | | | | 257/E51.026 |
| 2010/0068375 | A1 | 3/2010 | Kawakami | |
| 2011/0052833 | A1 | 3/2011 | Manawa et al. | |
| 2011/0220148 | A1 | 9/2011 | Consiglio et al. | |
| 2013/0133573 | A1* | 5/2013 | Joo | C23C 14/042 |
| | | | | 118/504 |
| 2014/0345644 | A1* | 11/2014 | Okabe | C23C 16/4405 |
| | | | | 134/1.1 |
| 2016/0147234 | A1* | 5/2016 | Leeser | F16K 7/17 |
| | | | | 137/596.12 |
| 2016/0153085 | A1* | 6/2016 | Ueda | C23C 16/4408 |
| | | | | 118/730 |
| 2016/0303620 | A1 | 10/2016 | Kim et al. | |

FOREIGN PATENT DOCUMENTS

| | | | |
|---|---|---|---|
| JP | H02308534 | A | 12/1990 |
| JP | 2002-100624 | A | 4/2002 |
| JP | 2003197605 | A | 7/2003 |
| JP | 2004146184 | A | 5/2004 |
| JP | 2005043052 | A | 2/2005 |
| JP | 200888483 | A | 4/2008 |
| JP | 2008538592 | A | 10/2008 |
| JP | 2010153088 | A | 7/2010 |
| JP | 2011508434 | A | 3/2011 |
| JP | 2016517134 | A | 6/2016 |
| KR | 20010039860 | A | 5/2001 |
| KR | 10-2004-0073777 | A | 8/2004 |
| KR | 10-2007-0088260 | A | 8/2007 |
| KR | 20070085708 | A | 8/2007 |
| KR | 10-2009-0006265 | A | 1/2009 |
| KR | 20090035578 | A | 4/2009 |
| KR | 10-2010-0049599 | A | 5/2010 |
| KR | 20160006073 | A | 1/2016 |
| KR | 20170022310 | A | 3/2017 |
| TW | 201203418 | A | 1/2012 |
| WO | 2010055851 | A1 | 5/2010 |

OTHER PUBLICATIONS

Korean Office Action dated Sep. 5, 2019 for Application No. 10-2018-7020157.
Japan Office Action dated Jul. 23, 2019 for Application No. 2018-533256.
Chinese Office Action dated Jul. 17, 2020 for Application No. 201780008895.5.
Korean Office Action dated May 26, 2020 for Application No. 10-2018-7020157.
Japanese Office Action dated Mar. 3, 2020 for Application No. 2018-533256.
Notice of Allowance for Korean Application No. 10-2018-7020157 dated Jan. 5, 2021.
Office Action for Korean Application No. 10-2021-7009614 dated Jun. 2, 2021.
Wang, Fu-Zhen et al., "Surface Deposition Technology", China Machine Press, Edition 1; Mar. 31, 1989, pp. 189-191.
Chinese Office Action dated Jul. 21, 2021 for Application No. 201780008895.5.
Korean Office Action dated Apr. 24, 2022 for Application No. 10-2016-0006073.
Japanese Office Action dated Apr. 19, 2022 for Application No. 2021-063453.
Korean Office Action dated Oct. 26, 2022 for Application No. 10-2022-7006170.
Chinese Office Action dated Aug. 15, 2022 for Application No. 202011062624.8.
Notice in related application KR 10-2023-7044092 dated Aug. 7, 2024.
Korean Office Action dated Apr. 28, 2025 for Application No. 10-2023-7044092.

\* cited by examiner

METHOD FOR CLEANING A VACUUM SYSTEM USED IN THE MANUFACTURE OF OLED DEVICES, METHOD FOR VACUUM DEPOSITION ON A SUBSTRATE TO MANUFACTURE OLED DEVICES, AND APPARATUS FOR VACUUM DEPOSITION ON A SUBSTRATE TO MANUFACTURE OLED DEVICES

PRIORITY

This application is a U.S. Non-Provisional application that is a continuation of application Ser. No. 16/318,052, filed on Jan. 15, 2019, which is a national stage of International Patent Application No. PCT/EP2017/060239, filed on Apr. 28, 2017, each of which are here in incorporated by reference.

FIELD

Embodiments of the present disclosure relate to a method for cleaning a vacuum system, a method for vacuum deposition on a substrate, and an apparatus for vacuum deposition on a substrate. Embodiments of the present disclosure particularly relate to methods and apparatuses used in the manufacture of organic light-emitting diode (OLED) devices.

BACKGROUND

Techniques for layer deposition on a substrate include, for example, thermal evaporation, physical vapor deposition (PVD), and chemical vapor deposition (CVD). Coated substrates may be used in several applications and in several technical fields. For instance, coated substrates may be used in the field of organic light emitting diode (OLED) devices. OLEDs can be used in the manufacture of television screens, computer monitors, mobile phones, other hand-held devices, and the like for displaying information. An OLED device, such as an OLED display, may include one or more layers of an organic material situated between two electrodes that are all deposited on a substrate.

OLED devices can include a stack of several organic materials, which are for example evaporated in a vacuum chamber of a processing apparatus. The organic materials are deposited on a substrate in a subsequent manner through shadow masks using evaporation sources. The vacuum conditions inside the vacuum chamber are crucial for a quality of the deposited material layers and the OLED devices manufactured using these material layers.

Therefore, there is a need for a method and apparatus that can improve vacuum conditions inside a vacuum chamber. The present disclosure particularly aims at improving vacuum conditions such that a quality of layers of an organic material deposited on a substrate can be improved.

SUMMARY

In light of the above, a method for cleaning a vacuum system used in the manufacture of OLED devices, a method for vacuum deposition on a substrate to manufacture OLED devices, and an apparatus for vacuum deposition on a substrate to manufacture OLED devices are provided. Further aspects, benefits, and features of the present disclosure are apparent from the claims, the description, and the accompanying drawings.

According to an aspect of the present disclosure, a method for cleaning a vacuum system used in the manufacture of OLED devices is provided. The method includes performing pre-cleaning for cleaning at least a portion of the vacuum system, and performing plasma cleaning using a remote plasma source.

According to another aspect of the present disclosure, a method for cleaning a vacuum system used in the manufacture of OLED devices is provided. The method includes performing plasma cleaning of at least a portion of the vacuum system as a final cleaning procedure using a remote plasma source.

According to yet another aspect of the present disclosure, a method for vacuum deposition on a substrate to manufacture OLED devices is provided. The method includes performing pre-cleaning for cleaning at least a portion of the vacuum system, performing plasma cleaning using a remote plasma source for cleaning at least the portion of the vacuum system, and depositing one or more layers of an organic material on the substrate.

According to a further aspect of the present disclosure, an apparatus for vacuum deposition on a substrate to manufacture OLED devices is provided. The apparatus includes a vacuum chamber, a remote plasma source connected to the vacuum chamber, and a controller connected to the remote plasma source to perform plasma cleaning as a final cleaning procedure.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

The vacuum conditions inside a vacuum chamber can be crucial for a quality of material layers deposited on a substrate. In particular, for OLED mass production, a cleanliness of all vacuum components is essential. Even electro-polished surfaces may be still too dirty for OLED device fabrication. The present disclosure uses a remote plasma source after a pre-cleaning procedure e.g. as a final cleaning procedure for a vacuum system. The plasma cleaning can be used to treat the vacuum chamber and/or parts or compo-nents of the vacuum system. As an example, the plasma cleaning can be performed in vacuum before a process startup or starting production to improve cleanliness levels. The treatment can be performed for a certain time with a remote plasma of e.g. pure oxygen or oxygen mixtures with nitrogen or argon. The cleanliness levels can be significantly enhanced and a quality of the layers deposited on a substrate can be improved.

Figure 1:
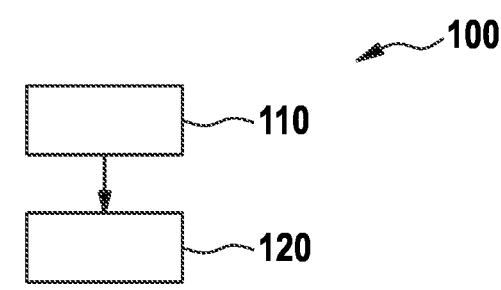
FIG. 1 shows a flowchart of a method for cleaning a vacuum system used in the manufacture of OLED devices according to embodiments described herein.

FIG. 1 shows a flowchart of a method 100 for cleaning a vacuum system used in the manufacture of OLED devices according to embodiments described herein.

The method 100 includes performing pre-cleaning for cleaning at least a portion of the vacuum system (block 110), and performing plasma cleaning using a remote plasma source (block 120). The plasma cleaning can be a final cleaning procedure before operating the vacuum system e.g. to deposit layers of one or more organic materials on a substrate. The term "final" is to be understood in the sense that no further cleaning procedures are performed after the plasma cleaning.

In the remote plasma source, a gas is typically activated in a remote chamber distant from a vacuum chamber in which the cleaning treatment is to be performed. Such an activation may be carried out e.g. in the remote plasma source. Examples of remote plasmas used in the embodi-ments of the present disclosure include, but are not limited to, remote plasmas of pure oxygen or oxygen mixtures with nitrogen or argon.

The plasma cleaning as a final cleaning procedure can significantly improve a cleanliness level of the vacuum system. The inventors have found that the plasma cleaning as a final cleaning procedure can provide a cleanliness level of the cleaned items in the range of less than $10^{-9}$ grams/cm$^2$ when measured using a standard GCMS (gas chromatogra-phy-mass spectrometry) procedure. Accordingly, vacuum conditions and thus a quality of the layers of an organic material deposited on the substrate can be improved.

According to some embodiments, which can be combined with other embodiments described herein, the plasma clean-ing can be performed for a predetermined period of time. The predetermined period of time can be selected such that a cleanliness level of $10^{-8}$ grams/cm$^2$ or less, specifically $10^{-9}$ grams/cm$^2$ or less, and more specifically $10^{-10}$ grams/cm$^2$ or less is provided (measured using a standard GCMS procedure). The cleanliness level can be defined as grams of one or more selected contaminants per cm$^2$ of a surface area of the portion of the vacuum system to be cleaned, such as a surface of inner chamber walls of a vacuum chamber of the vacuum system.

The pre-cleaning for cleaning at least the portion of the vacuum system and the plasma cleaning using a remote plasma source for cleaning at least the portion of the vacuum system can be used for various components of the vacuum system. In some implementations, the pre-cleaning and the plasma cleaning respectively include a cleaning of the vacuum chamber. As an example, the pre-cleaning and the plasma cleaning respectively include a cleaning of one or more inner walls of the vacuum chamber. The one or more inner walls can be pre-cleaned using for instance a wet chemical cleaning process and can then be plasma-cleaned to improve the cleanliness level.

Additionally or alternatively, the pre-cleaning and the plasma cleaning respectively include a cleaning of one or more components inside the vacuum chamber of the vacuum system. The one or more components can be selected from the group consisting of mechanical components, moveable components, drives, valves, and any combination thereof. As an example, the mechanical components can be any com-ponents provided inside the vacuum chamber, such as move-able components used for operating the vacuum system. An exemplary movable component includes, but is not limited to, a valve, such as a gate valve. The drives can include drives used for transportation of substrates and/or carriers in the vacuum system, drives or actuators for substrate and/or mask alignment, drives for valves, such as gate valves, separating adjacent vacuum regions or chambers, and the like.

According to some embodiments, which can be combined with other embodiments described herein, the pre-cleaning and the plasma cleaning respectively include a cleaning of one or more mask devices, such as shadow masks, used during a deposition process. In particular, the masks can be treated with the remote plasma before the masks are used in a production process. In some implementations, the one or more mask devices can be plasma-cleaned for a certain time in a load lock chamber or a chamber dedicated to this purpose, such as a cleaning chamber. The pre-cleaning and plasma cleaning can be performed with the one or more mask devices being at the same location, such as the load lock chamber or cleaning chamber. In another example, the pre-cleaning and the plasma cleaning can be performed at different locations. As an example, the pre-cleaning can be performed outside the vacuum system. After that pre-clean-ing, the one or more mask devices can be moved for instance into the load lock chamber or cleaning chamber and the plasma cleaning using the remote plasma source can be performed.

According to some embodiments, which can be combined with other embodiments described herein, the method 100 is performed after a maintenance procedure of the vacuum system or portions of the vacuum system. In particular, wet cleaning after maintenance may not be sufficient to achieve proper cleanliness levels for OLED mass production. The second cleaning procedure, i.e., the plasma cleaning, after a first cleaning procedure, i.e., the pre-cleaning, can ensure cleanliness levels that can improve a quality of the layers of the organic materials deposited during a deposition process, such as a thermal evaporation process.

The term "maintenance procedure" can be understood in the sense that the vacuum system is not operated to be able to perform various tasks, such as servicing and/or initial installation of the vacuum system or portions of the vacuum system. The maintenance procedure can be performed cycli-cally, e.g., in predetermined servicing intervals. The method 100 can be a method for basic cleaning of the vacuum system or portions of the vacuum system after the comple-tion of the maintenance procedure.

In some implementations, the plasma cleaning is per-formed in one or more (vacuum) chambers of the vacuum system selected from the group consisting of a load lock chamber, a cleaning chamber, a vacuum deposition chamber, a vacuum processing chamber, a transfer chamber, a routing module, and any combination thereof. The pre-cleaning can be performed in the same chamber where the plasma cleaning is performed. Alternatively, the pre-cleaning can be performed at a different location, such as a different chamber or outside the vacuum system. According to some embodiments, the pre-cleaning is performed under atmosphere and the plasma cleaning is performed under vacuum.

According to some embodiments, which can be combined with other embodiments described herein, the pressure in the vacuum chamber is reduced to 10 mbar or less, specifically $10^{-1}$ mbar or less, and more specifically $10^{-2}$ mbar or less for the plasma cleaning process. The pressure can be reduced after the pre-cleaning to establish a technical vacuum. As an example, the pressure in the vacuum chamber can be in the range between $10^{-2}$ mbar and 10 mbar, specifically in the range between $10^{-1}$ mbar and 2 mbar, and more specifically in the range between $10^{-1}$ mbar and 1.5 mbar. One or more vacuum pumps, such as turbo pumps and/or cryo-pumps, connected to the vacuum chamber for generation of the technical vacuum inside the vacuum chamber can be provided.

The method 100 includes the pre-cleaning, which may include one or more pre-cleaning procedures. The pre-cleaning can be performed before the pressure in the vacuum chamber is reduced to perform the plasma cleaning. The one or more pre-cleaning procedures can include, for example, a wet chemical cleaning process.

In the following, a method according to the present disclosure using the remote plasma source is described. Firstly, the vacuum system or the portion(s) of the vacuum system can be pre-cleaned using for instance wet chemical cleaning. Then, a vacuum pressure e.g. of about 0.1 to about 5 mbar is established inside the vacuum chamber by pumping. After that, the remote plasma source is started and plasma cleaning is performed to provide the improved cleanliness level.

Figure 2:
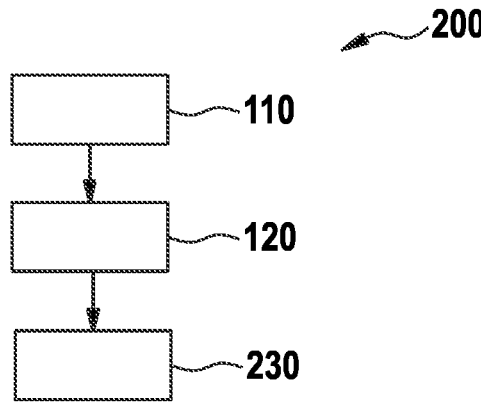
FIG. 2 shows a flowchart of a method for vacuum deposition on a substrate to manufacture OLED devices according to embodiments described herein.

FIG. 2 shows a flowchart of a method 200 for vacuum deposition on a substrate to manufacture OLED devices. The method 200 can include the aspects of the method for cleaning a vacuum system used in the manufacture of OLED devices according to the present disclosure.

The method 200 includes performing pre-cleaning for cleaning at least a portion of the vacuum system (block 110), performing plasma cleaning using a remote plasma source for cleaning at least the portion of the vacuum system (block 120), and depositing one or more layers of an organic material on the substrate (block 230).

The plasma cleaning as a final cleaning procedure can significantly improve a cleanliness level of the vacuum system. The plasma cleaning as a final cleaning procedure can provide a cleanliness level of the cleaned items in the range of less than $10^{-9}$ grams/cm$^2$ when measured using a standard GCMS (gas chromatography-mass spectrometry) procedure. Accordingly, vacuum conditions and thus a quality of the layers of an organic material deposited on the substrate can be improved.

Figure 3:
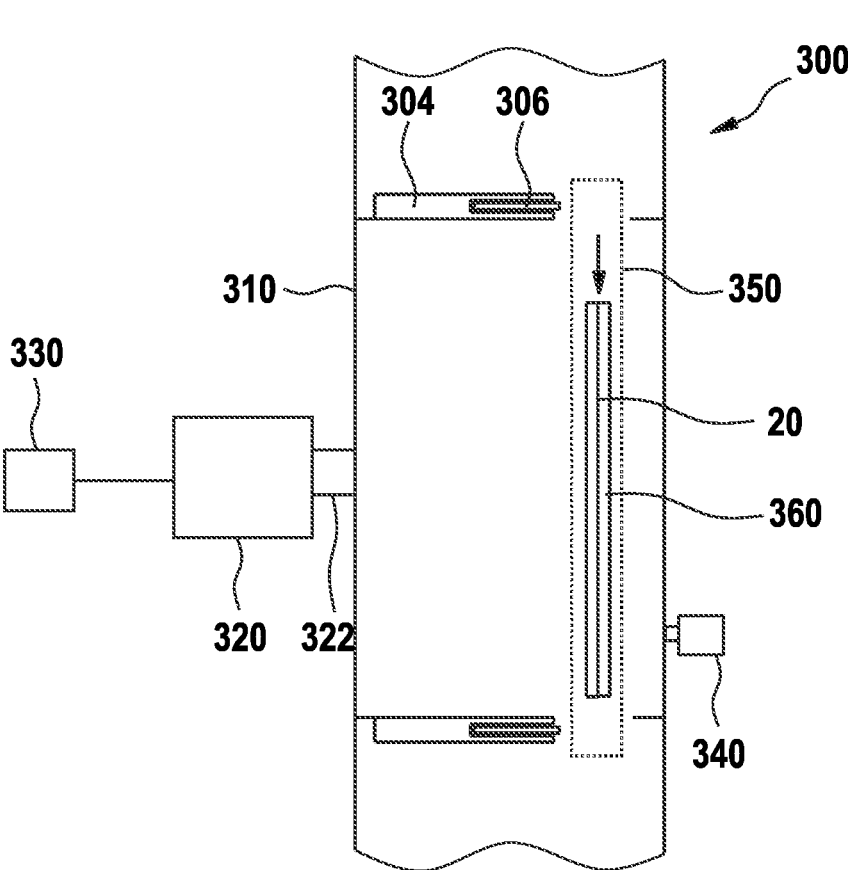
FIG. 3 shows a schematic view of an apparatus for vacuum deposition on a substrate to manufacture OLED devices according to embodiments described herein.

FIG. 3 shows an apparatus 300 for vacuum deposition on a substrate to manufacture OLED devices according to embodiments described herein.

The apparatus 300 includes a vacuum chamber 310, a remote plasma source 320 connected to the vacuum chamber 310, and a controller 330 connected to the remote plasma source 320 to performing plasma cleaning as a final cleaning procedure. In particular, the controller 330 can be configured to implement the method for cleaning a vacuum system used in the manufacture of OLED devices of the present disclosure.

The vacuum chamber 310 can be selected from the group consisting of a load lock chamber, a cleaning chamber, a vacuum deposition chamber, a vacuum processing chamber, a transfer chamber, a routing module, and any combination thereof. As an example, vacuum chamber 310 can be a vacuum processing chamber used for deposition of an organic material on a substrate.

One or more vacuum pumps 340, such as turbo pumps and/or cryo-pumps, can be connected to the vacuum chamber 310 e.g. via one or more tubes such as bellow tubes for the generation of a technical vacuum inside the vacuum chamber 310. The controller 330 can further be configured to control the one or more vacuum pumps 340 to reduce the pressure in the vacuum chamber 310 e.g., prior to the plasma cleaning procedure.

The term "vacuum" as used throughout the present disclosure can be understood in the sense of a technical vacuum having a vacuum pressure of less than, for example, 10 mbar. The pressure in the vacuum chamber may be between $10^{-5}$ mbar and about $10^{-8}$ mbar, specifically between $10^{-5}$ mbar and $10^{-7}$ mbar, and more specifically between about $10^{-6}$ mbar and about $10^{-7}$ mbar.

The remote plasma source 320 is connected to the vacuum chamber 310 at a gas injection point 322. As an example, the remote plasma source 320 can be vacuum tightly connected to the vacuum chamber 310 using for instance a flange. In some implementations, a gas inlet manifold, such as a showerhead, can be provided at the gas injection point 322, e.g., inside the vacuum chamber 310. The gas inlet manifold can be configured to evenly distribute the (reactive) gas inside the vacuum chamber 310. The gas inlet manifold can provide for a uniform cleaning process inside the vacuum chamber 310.

According to some embodiments, the apparatus 300 can be included in a vacuum processing system for the manufacture of devices having organic materials therein, such as OLED devices. As an example, the apparatus 300 can include one or more material deposition sources, such as evaporation sources, in the vacuum chamber configured for deposition of one or more organic materials on the substrate.

The vacuum processing system, and particularly the apparatus can include a transport arrangement 350 configured for contactless transportation of a carrier, such as a substrate carrier and/or a mask carrier 360, in the vacuum chamber 310. As an example, the plasma cleaning of the mask 20 can be performed with the mask 20 being held by the mask carrier 360 in the vacuum chamber 310, which may be a vacuum processing chamber or a separate cleaning chamber.

In some implementations, the vacuum processing system includes one or more material deposition sources (not shown), such as one or more evaporation sources, in the vacuum chamber 310. The vacuum processing system can be configured for evaporation of, for example, an organic material for the manufacture of OLED devices. In some implementations, the one or more material deposition sources can be evaporation sources, and particularly evaporation sources for depositing one or more organic materials on a substrate to form a layer of an OLED device. The mask carrier 360, which can be further configured for supporting the substrate 10 e.g. during a layer deposition process, can be transported into and through the vacuum chamber 310, and in particular through a deposition area, along a transportation path, such as a linear transportation path.

As indicated in FIG. 3, further chambers can be provided adjacent to the vacuum chamber 310. The vacuum chamber 310 can be separated from adjacent chambers by a valve having a valve housing 304 and a valve unit 306. After the carrier with the mask 20 and/or the substrate thereon is inserted into the vacuum chamber 310 as indicated by the arrow, the valve unit 306 can be closed. The atmosphere in the vacuum chamber 310 can be individually controlled by generating the technical vacuum, for example with vacuum pumps connected to the vacuum chamber 310, e.g. prior to the plasma cleaning.

In some implementations, the vacuum processing system can include one or more transportation paths extending through the vacuum chamber 310. The carrier can be configured for transportation along the one or more transportation paths, for example, past the one or more material deposition sources. Although one transportation path is exemplarily indicated by the arrow, it is to be understood that the present disclosure is not limited thereto, and that two or more transportation paths can be provided. As an example, at least two transportation paths can be arranged substantially parallel to each other for transportation of respective carriers. The one or more material deposition sources can be arranged between the two transportation paths.

The transport arrangement 350 can be configured for contactless levitation and/or contactless transportation of the carrier, such as the mask carrier 360, in the vacuum chamber 310, e.g., along the one or more transportation paths in a transport direction. The contactless levitation and/or transportation of the carrier is beneficial in that no particles are generated during transportation, for example due to mechanical contact with guide rails. An improved purity and uniformity of the layers deposited on the substrate can be provided, since particle generation is minimized when using the contactless levitation and/or transportation.

Figure 4:
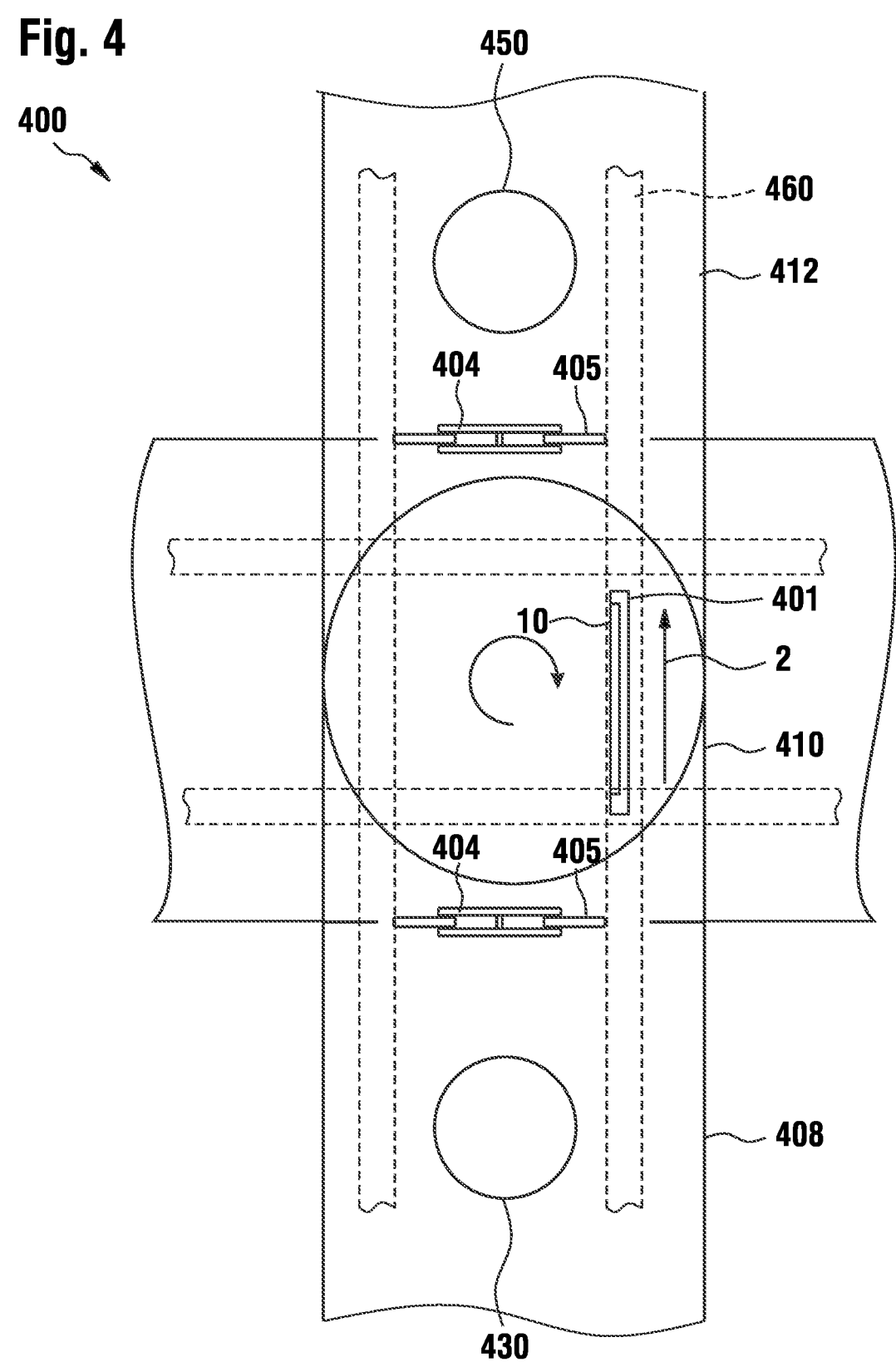
FIG. 4 shows a schematic view of a system for the manufacture of devices having organic materials according to embodiments described herein.

FIG. 4 shows a schematic view of a system 400 for the manufacture of devices having organic materials according to embodiments described herein. The system 400 can be cleaned using the methods and apparatus according to the embodiments described herein.

The system 400 includes two or more processing regions and a transport arrangement 460 configured for sequentially transporting a carrier 401 supporting a substrate 10 and optionally a mask to the two or more processing regions. As an example, the transport arrangement 460 can be configured for transporting the carrier 401 along a transport direction 2 through the two or more processing regions for substrate processing. In other words, the same carrier is used for transportation of the substrate 10 through multiple processing regions. In particular, the substrate 10 is not removed from the carrier 401 between substrate processing in a processing region and substrate processing in a subsequent processing region, i.e., the substrate stays on the same carrier for two or more substrate processing procedures.

As exemplarily illustrated in FIG. 4, the two or more processing regions can include a first deposition region 408 and a second deposition region 412. Optionally, a transfer region 410 can be provided between the first deposition region 408 and the second deposition region 412. The plurality of regions, such as the two or more processing regions and the transfer region, can be provided in one vacuum chamber. Alternatively, the plurality of regions can be provided in different vacuum chambers connected to each other. As an example, each vacuum chamber can provide one region. Specifically, a first vacuum chamber can provide the first deposition region 408, a second vacuum chamber can provide the transfer region 410, and a third vacuum chamber can provide the second deposition region 412. In some implementations, the first vacuum chamber and the third vacuum chamber can be referred to as "deposition chambers". The second vacuum chamber can be referred to as "processing chamber". Further vacuum chambers or regions can be provided adjacent to the regions shown in the example of FIG. 4.

The vacuum chambers or regions can be separated from adjacent regions by a valve having a valve housing 404 and a valve unit 405. After the carrier 401 with the substrate 10 thereon is inserted into a region, such as the second deposition region 412, the valve unit 405 can be closed. The atmosphere in the regions can be individually controlled by generating the technical vacuum, for example, with vacuum pumps connected to the regions and/or by inserting one or more process gases, for example, in the first deposition region 408 and/or the second deposition region 412. A transportation path, such as a linear transportation path, can be provided in order to transport the carrier 401, having the substrate 10 thereon, into, through and out of the regions. The transportation path can extend at least in part through the two or more processing regions, such as the first deposition region 408 and the second deposition region 412, and optionally through the transfer region 410.

The system 400 can include the transfer region 410. In some embodiments, the transfer region 410 can be omitted. The transfer region 410 can be provided by a rotation module, a transit module, or a combination thereof. FIG. 4 illustrates a combination of a rotation module and a transit module. In the rotation module, the track arrangement and the carrier(s) arranged thereon can be rotated around a rotational axis, such as a vertical rotation axis. As an example, the carrier(s) can be transferred from the left side of the system 400 to the right side of the system 400, or vice versa. The transit module can include crossing tracks such that carrier(s) can be transferred through the transit module in different directions, e.g., directions perpendicular to each other.

Within the deposition regions, such as the first deposition region 408 and the second deposition region 412, one or more deposition sources can be provided. As an example, a first deposition source 430 can be provided in the first deposition region 408. A second deposition source 450 can be provided in the second deposition region 412. The one or more deposition sources can be evaporation sources configured for deposition of one or more organic layers on the substrate 10 to form an organic layer stack for an OLED device.

The systems described herein can be utilized for evaporation on large area substrates, e.g., for OLED display manufacturing. Specifically, the substrates for which the systems according to embodiments described herein are provided, are large area substrates. For instance, a large area substrate or carrier can be GEN 4.5, which corresponds to a surface area of about 0.67 m² (0.73×0.92 m), GEN 5, which corresponds to a surface area of about 1.4 m² (1.1 m×1.3 m), GEN 7.5, which corresponds to a surface area of about 4.29 m² (1.95 m×2.2 m), GEN 8.5, which corresponds to a surface area of about 5.7 m² (2.2 m×2.5 m), or even GEN 10, which corresponds to a surface area of about 8.7 m² (2.85 m×3.05 m). Even larger generations such as GEN 11 and GEN 12 and corresponding surface areas can similarly be implemented. Half sizes of the GEN generations may also be provided in OLED display manufacturing.

The present disclosure uses a remote plasma source after a pre-cleaning procedure e.g. as a final cleaning procedure for a vacuum system. The plasma cleaning can be used to treat the vacuum chamber and/or parts or components of the vacuum system. As an example, the plasma cleaning can be performed in vacuum before a process startup or starting production to improve cleanliness levels. The treatment can be performed for a certain time with a remote plasma of e.g. pure oxygen or oxygen mixtures with nitrogen or argon. The cleanliness levels can be significantly enhanced and a quality of the layers deposited on a substrate can be improved.

While the foregoing is directed to embodiments of the disclosure, other and further embodiments of the disclosure may be devised without departing from the basic scope thereof, and the scope thereof is determined by the claims that follow.

The invention claimed is:

1. A method for cleaning a vacuum system, comprising:
   pre-cleaning a chamber of the vacuum system at a first pressure within the chamber;
   reducing the pressure within the chamber from the first pressure to a second pressure to establish a technical vacuum; and
   plasma cleaning the chamber using a remote plasma source, wherein plasma cleaning the chamber is performed at the second pressure within the chamber.

2. The method of claim 1, wherein the plasma cleaning is a final cleaning procedure before operating the vacuum system.

3. The method of claim 1, wherein the chamber comprises a vacuum chamber.

4. The method of claim 3, wherein plasma cleaning the chamber comprises cleaning one or more inner walls of the vacuum chamber.

5. The method of claim 1, wherein plasma cleaning the chamber comprises cleaning one or more components inside the chamber.

6. The method of claim 5, wherein the one or more components are selected from the group consisting of mechanical components, moveable components, drives, valves, and any combination thereof.

7. The method of claim 1, wherein the method further comprises plasma cleaning one or more mask devices used during a deposition process.

8. The method of claim 1, wherein the method is performed after a maintenance procedure of the vacuum system or portions of the vacuum system.

9. The method of claim 1, wherein plasma cleaning the chamber comprises plasma cleaning one or more chambers of the vacuum system selected from the group consisting of a load lock chamber, a cleaning chamber, a vacuum deposition chamber, a vacuum processing chamber, a transfer chamber, a routing module, and any combination thereof.

10. The method of claim 1, wherein plasma cleaning the chamber comprises using a plasma of pure oxygen or oxygen mixtures with nitrogen or argon.

11. The method of claim 1, wherein pre-cleaning the chamber comprises a wet chemical cleaning process.

12. The method of claim 1, wherein the second pressure is about $10^{-2}$ mbar or less.

13. The method of claim 1, wherein plasma cleaning the chamber provides a cleanliness level or $10^{-9}$ grams/cm$^2$ when measured using a standard gas chromatography-mass spectrometry (GCMS) procedure.

14. A method for vacuum deposition on a substrate, comprising:
   pre-cleaning a chamber of the vacuum system at a first pressure within the chamber;
   reducing the pressure within the chamber from the first pressure to a second pressure to establish a technical vacuum;
   plasma cleaning the chamber using a remote plasma source, wherein plasma cleaning the chamber is performed at the second pressure within the chamber; and
   depositing one or more layers of material on a substrate.

15. The method of claim 14, wherein plasma cleaning the chamber comprises using a plasma of pure oxygen or oxygen mixtures with nitrogen or argon.

16. The method of claim 14, wherein pre-cleaning the chamber comprises a wet chemical cleaning process.

17. The method of claim 14, wherein the second pressure is about $10^{-2}$ mbar or less.

18. The method of claim 14, wherein plasma cleaning the chamber provides a cleanliness level or $10^{-9}$ grams/cm$^2$ when measured using a standard gas chromatography-mass spectrometry (GCMS) procedure.

19. An apparatus for vacuum deposition on a substrate, comprising:
   a vacuum chamber;
   a remote plasma source connected to the vacuum chamber; and
   a controller connected to the remote plasma source to perform a plasma cleaning as a final cleaning procedure, wherein the controller is configured to implement a method for cleaning a vacuum system, the method comprising:
   pre-cleaning a chamber of the vacuum system at a first pressure within the chamber,
   reducing the pressure within the chamber from the first pressure to a second pressure to establish a technical vacuum, and
   plasma cleaning the chamber using a remote plasma source, wherein plasma cleaning the chamber is performed at the second pressure within the chamber.

20. The method of claim 19, wherein the second pressure is about $10^{-2}$ mbar or less.

* * * * *